United States Patent [19]

Kim

[11] Patent Number: 5,174,745

[45] Date of Patent: Dec. 29, 1992

[54] IMPURITY DIFFUSING FURNACE

[75] Inventor: Yunki Kim, Kangwon, Rep. of Korea

[73] Assignee: Samsung Electronics Co., Ltd., Kyunggi, Rep. of Korea

[21] Appl. No.: 829,410

[22] Filed: Feb. 3, 1992

Related U.S. Application Data

[63] Continuation of Ser. No. 662,215, Feb. 27, 1991, abandoned.

[30] Foreign Application Priority Data

Dec. 3, 1990 [KR] Rep. of Korea ............... 90-19747

[51] Int. Cl.$^5$ ................................................. F27D 5/00
[52] U.S. Cl. ............................................ 432/5; 432/6; 432/253
[58] Field of Search ................... 432/5, 6, 47, 57, 152, 432/205

[56] References Cited

U.S. PATENT DOCUMENTS

| | | | |
|---|---|---|---|
| 3,690,629 | 9/1972 | Scott | 263/33 B |
| 4,437,835 | 3/1984 | Martin | 432/103 |
| 4,439,146 | 3/1984 | Sugita | 432/253 |
| 4,569,658 | 2/1986 | Wiggins et al. | 432/47 |
| 4,613,305 | 9/1986 | Sakurai | 432/253 |
| 4,726,764 | 2/1988 | Yoshikai | 432/24 |
| 4,955,808 | 9/1990 | Miyagawa | 432/5 |

Primary Examiner—Henry C. Yuen
Attorney, Agent, or Firm—Christie, Parker & Hale

[57] ABSTRACT

An impurity furnace is disclosed, which includes: an atmoscan tube 1, a gas inlet 20, a processor tube 2, a door flange 60 and a discharge tube 70.

A pressure gage 80 is installed at a side of the door flange 60, for measuring the internal pressure of the atmoscan tube 1 and transmitting the measured value thereof in the form of electrical signals. A microcomputer 3 connected to pressure gage compares the measured value of the pressure gage with a preset reference value, and generates control signals in order to control the opening degree of a butterfly valve 90. The butterfly valve is connected to the microcomputer 3, the opening degree thereof being controlled by the value controlling the signals from the microcomputer 3. The discharge tube extends from the interior of the atmoscan tube to the butterfly valve.

6 Claims, 3 Drawing Sheets

IMPURITY DIFFUSING FURNACE

CROSS REFERENCE TO COPENDING APPLICATION

This application is a continuation of application Ser. No. 07/662,215, filed Feb. 27, 1991, now abandoned.

BACKGROUND OF THE INVENTION

(1) Field of the Invention

The present invention relates to an impurity diffusing furnace, and particularly to an impurity diffusing furnace in which the gas pressure within an atmoscan tube of the diffusing furnace is maintained at a constant level.

(2) Description of the Prior Art

FIG. 1 schematically illustrates the conventional impurity diffusing furnace. As shown in this drawing, an atmoscan tube 1 with a plurality of wafers (not shown) loaded on an internal cell boat 40 is introduced into a processor tube 2, and an amount of process gas is injected through a gas inlet 20, maintaining a certain constant temperature on a heater block 30, thereby diffusing an impurity into the wafer. The atmoscan tube referred to is of the type produced by BTU International, and identified as "3400 H-3800 H Systems".

In such an impurity diffusing furnace, in order to constantly maintain the internal gas pressure of the atmoscan tube which affects the impurity diffusing state of the wafer, the gas is discharged to the outside through a discharge tube 70 which is provided on a door flange 60 of the atmoscan tube 1, the discharge being made in accordance with the internal gas pressure of the atmoscan tube 1. In the drawing, reference code 50 indicates a fixed baffle.

However, if the discharge of the gas doesn't keep constant, variations in the temperature and the diffusing speed occur, thereby making it impossible to obtain uniform wafers. For this reason, the conventional impurity diffusing furnace has to be operated in such a manner that the gas is introduced in the rate of 15-20 slm (standard liter per minute) which is an excessive amount compared with the reaction mechanism of the wafer and the internal volume of the atmoscan tube 1, with the result that the loading capability becomes low.

Further, depending on the difference of the level within the discharge tube (70), the vent pressure gage (not shown) of the gas outlet will show different gas discharge rate, and therefore, the uniformity of wafers will deteriorate, thereby causing difficulties in the function.

SUMMARY OF THE INVENTION

The present invention is intended to overcome the above described disadvantages of the conventional impurity diffusing furnace.

Therefore it is the object of the present invention to provide an impurity diffusing furnace in which a wafer can be formed uniform, by properly controlling the gas discharge rate in such a manner as to maintain the internal pressure of the impurity diffusing furnace constant.

In achieving the above object, an impurity diffusing furnace according to the present invention comprising an atmoscan tube, i.e., a cylindrical member, a processor tube provided with a gas injecting hole, and a discharge tube connected to a door flange, is characterized in that: a pressure gage for measuring the internal pressure of the atmoscan tube and transmitting the measured value in the form of electrical signals is installed at a side of the door flange; control means for comparing the measured pressure value with a reference pressure value to control the opening of a butterfly valve is connected to the pressure gage; the butterfly valve which is controlled by the control means is connected to the control means; and the discharge tube is extended from the interior of the atmoscan tube to the butterfly valve.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 2:
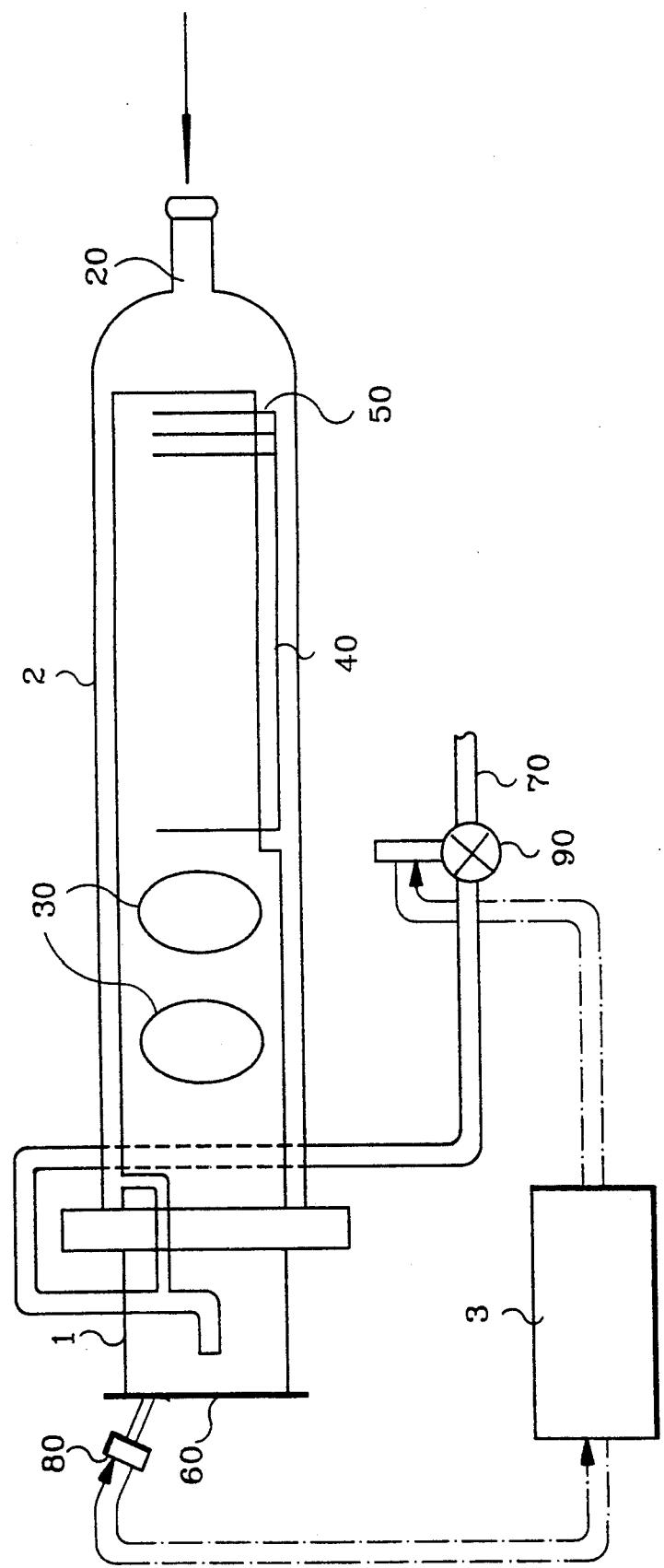
FIG. 2 is a schematic illustration showing the constitution of the impurity diffusing furnace according to the present invention.
Figure 3:
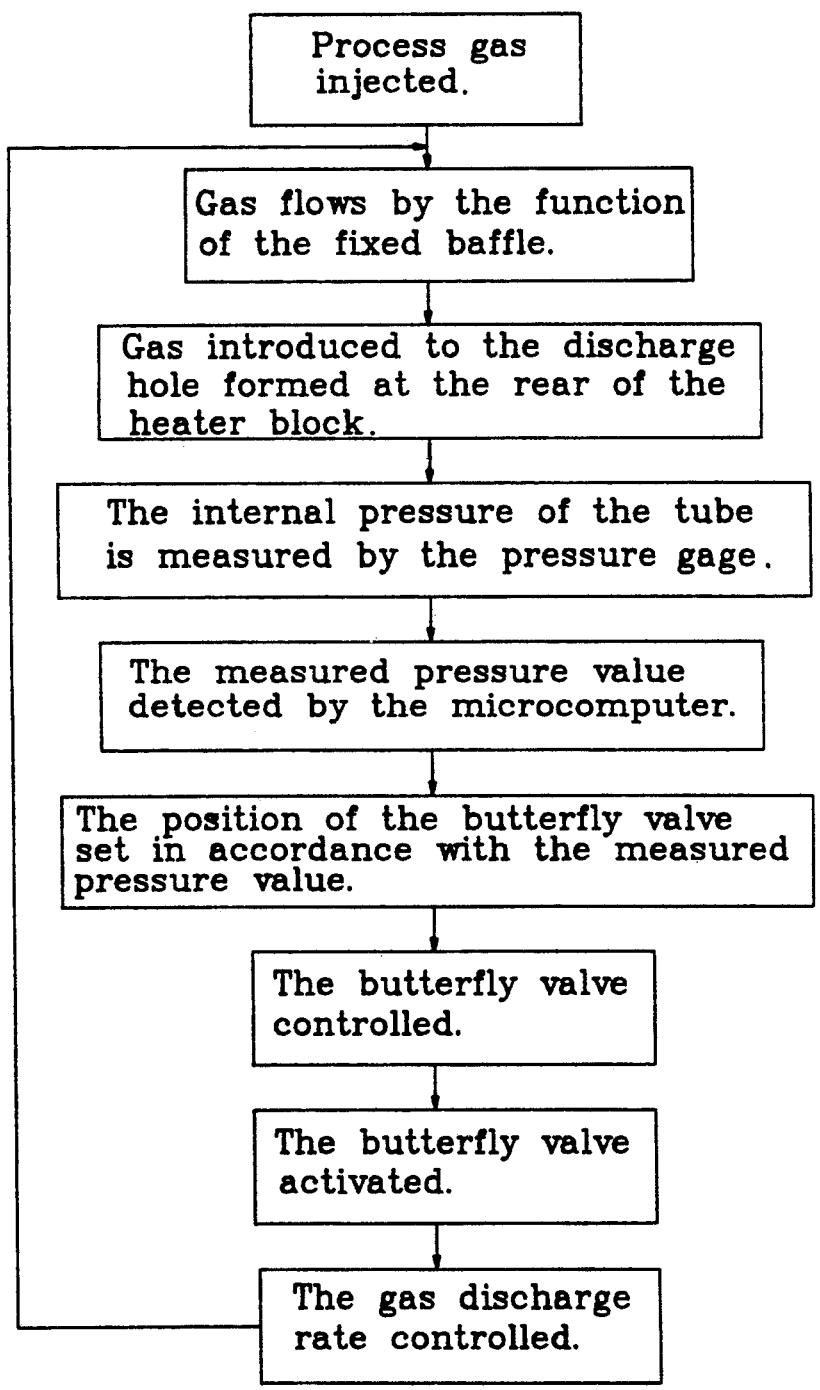
FIG. 3 is a flow chart showing the process of controlling the internal pressure of the impurity diffusing furnace according to the present invention.

FIG. 2 shows the constitution of the impurity diffusing furnace according to the present invention, and FIG. 3 is a flow chart showing the process of controlling the internal pressure of the impurity diffusing furnace of the present invention at a constant level.

Figure 1:
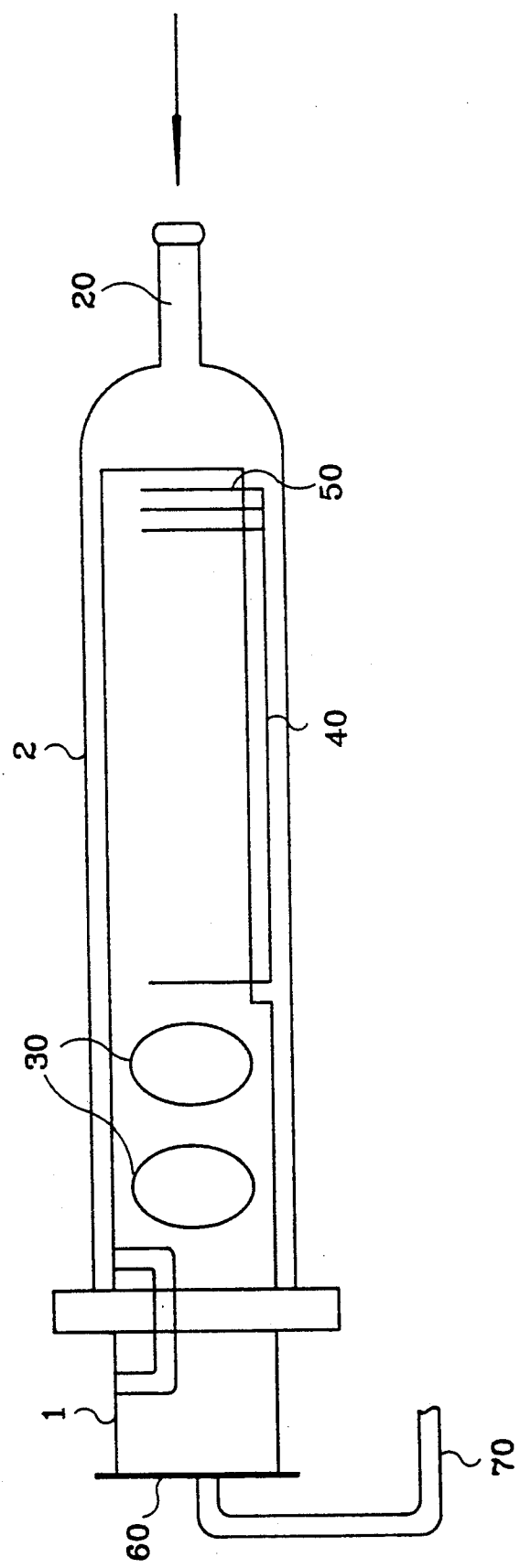
FIG. 1 is a schematic illustration of the conventional impurity diffusing furnace.

In FIG. 2, the parts which have the same constitutions as the parts of FIG. 1 are assigned with the same reference codes, and detailed descriptions on them will be skipped.

According to the present invention for this purpose, a discharge tube 70 is not connected to a door flange 60 of an atmoscan tube 1 as in the conventional apparatus, but is extended from an interior of the atmoscan tube 1 and to be connected through a side of the rear portion thereof.

Thus, the impurity diffusing furnace according to the present invention could be operated not only in the horizontal position as in the conventional impurity diffusing furnace, but also in the vertical position.

Further, this discharge tube 70 is provided with a butterfly valve 90 which is closed/opened by a microcomputer 3.

The door flange 60 is provided with a pressure gage 80 (such as capacitance nanometre) which is capable of measuring the internal pressure of the impurity diffusing furnace, and also capable of transmitting the measured value in the form of electrical signals.

The pressure gage 80 is connected to a microcomputer 3 which compares the measured pressure value (in the form of electrical signals) with a reference pressure value. If the inputted pressure value is smaller than the reference value, the microcomputer generates a valve closing signal, while if the inputted pressure value is larger than the reference value, the microcomputer generates a valve opening signal.

The valve opening/closing signals which are generated by the microcomputer 3 are transmitted to the butterfly valve 90 which is provided on the discharge tube 70. Thus, the valve 90 is closed or opened by the valve closing/opening signals from the microcomputer 3 in such a manner that the discharge rate of the gas from the atmoscan tube 1 and the processor tube 2 may be properly controlled.

The impurity diffusing furnace of the present invention constituted as above will now be described as to its operations.

If the processor gas is introduced through the gas inlet 20 into the tube, the gas flows into the baffle of a cell boat 40, and passes through the both surfaces of a wafer (not shown).

Then the gas passes through a fixed baffle 50 and the both faces of a heater block 30, and then is discharged to the outside through the discharge tube 70. Under this condition, if the gas is introduced into the interior of the atmoscan tube 1, the internal pressure of the tube is raised, and the rise of the pressure is detected by the pressure gage 80 which sends the measured data in the form of electrical signals to the microcomputer 3.

The microcomputer 3 compares the inputted pressure value with the reference value, and sends a valve closing or opening signal to the butterfly valve 90 in accordance with the positivity or negativity of the compared result, thereby controlling the butterfly valve. Thus the discharge operation of the gas through the discharge tube 70 is carried out in such a manner that the internal pressure of the atmoscan tube 1 may be kept at a constant level.

The above process will be described in further detail referring to FIG. 3.

If the processor gas is introduced through the gas inlet 20, a laminar flow of the gas is formed by the fixed baffle 50, and if a uniform gas is introduced to the discharge tube 70 or the rear portion of a heater block 30, the internal pressure of the atmoscan tube 1 is raised. The internal pressure of the atmoscan tube 1 is measured by the pressure gage 80 which is attached on the door flange 60 as a means for measuring the pressure.

The microcomputer 3 detects the measured pressure value, and compares the detected value with the reference value. If the detected value is larger than the reference value, the butterfly valve 90 is so controlled as to slightly open, while, if the detected value is smaller than the reference value, the butterfly valve 90 is so controlled as to open more. Thus, the discharge rate of the gas which is discharged through the discharge tube is properly controlled, thereby maintaining the internal pressure of the atmoscan tube 1 at a constant level.

According to the impurity diffusing furnace of the present invention as described above, the internal pressure of the atmoscan is maintained at a constant level, thereby improving the uniformity of the impurity diffusing furnace, and also improving the process efficiency.

What is claimed is:

1. A method of operating an impurity diffusing furnace to control the gas discharge rate so as to maintain the internal pressure within the furnace substantially constant, which comprises:
   providing said furnace with a gas inlet, a gas outlet, an adjustable valve for the gas outlet, and a furnace door and door flange;
   establishing a predetermined preset pressure to be maintained within the furnace;
   introducing gas into the furnace;
   measuring the internal pressure within the furnace;
   comparing the measured pressure with the preset pressure;
   adjusting the valve of the gas outlet in response to the measured internal pressure to provide a substantially constant pressure within the furnace.

2. A method according to claim 1 further comprising maintaining internal gas flow substantially constant.

3. A method according to claim 1 wherein the internal pressure within the furnace is measured through the furnace door by a pressure gauge.

4. A method according to claim 3 wherein the gas outlet is connected to the door flange and gas from within the furnace is allowed to be discharged through the adjustable valve of the gas outlet.

5. A method according to claim 1 further comprising:
   generating a first electrical signal corresponding to the preset pressure and a second electrical signal corresponding to the measured internal pressure within the furnace;
   comparing the first and second signals and generating a valve controlling signal for the adjustable valve of the gas outlet in response to said first and second signals; and
   adjusting the valve of the gas outlet in response to the valve controlling signal to maintain a substantially constant pressure within the furnace.

6. A method according to claim 5 wherein said first and second signals are established and compared to adjust the value of the gas outlet in a microcomputer.

* * * * *